US011102886B2

(12) United States Patent
Sung et al.

(10) Patent No.: US 11,102,886 B2
(45) Date of Patent: Aug. 24, 2021

(54) PRINTED CIRCUIT BOARD

(71) Applicant: SAMSUNG ELECTRO-MECHANICS CO., LTD., Suwon-si (KR)

(72) Inventors: Ki Jung Sung, Suwon-si (KR); Tae Seong Kim, Suwon-si (KR); Jae Woong Choi, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/728,437

(22) Filed: Dec. 27, 2019

(65) Prior Publication Data

US 2021/0100105 A1    Apr. 1, 2021

(30) Foreign Application Priority Data

Sep. 30, 2019  (KR) ........................ 10-2019-0120528

(51) Int. Cl.
| | |
|---|---|
| H05K 1/02 | (2006.01) |
| H05K 1/16 | (2006.01) |
| H05K 1/18 | (2006.01) |
| H05K 3/00 | (2006.01) |
| H05K 3/10 | (2006.01) |
| H05K 3/46 | (2006.01) |
| H01Q 7/00 | (2006.01) |
| H01Q 7/06 | (2006.01) |
| H01F 17/00 | (2006.01) |
| H01F 17/04 | (2006.01) |

(Continued)

(52) U.S. Cl.
CPC ............. *H05K 1/165* (2013.01); *H05K 1/115* (2013.01); *H05K 3/4644* (2013.01); *H05K 2201/086* (2013.01)

(58) Field of Classification Search
CPC .. H05K 1/02; H05K 1/16; H05K 1/18; H05K 3/00; H05K 3/10; H05K 3/46; H01Q 7/00; H01Q 7/06; H01F 17/00; H01F 17/04; H01F 41/00; H01F 41/02; H01F 41/04; H01F 41/06; H01F 41/24; F01F 27/28; F01F 27/29; F01F 27/245; F01F 27/255
USPC ........ 174/262, 257; 336/178, 199, 200, 221, 336/223, 233; 343/787, 788, 848, 866, 343/867; 361/748, 763
See application file for complete search history.

(56) References Cited

U.S. PATENT DOCUMENTS 5,552,756 A * 9/1996 Ushiro ................ H01F 17/0013
                                              336/200
5,781,091 A * 7/1998 Krone ................ H01F 17/0033
                                              336/200

(Continued)

FOREIGN PATENT DOCUMENTS

KR         10-0965339 B1    6/2010
KR    10-2017-0108581 A    9/2017

*Primary Examiner* — Xiaoliang Chen
(74) *Attorney, Agent, or Firm* — Morgan, Lewis & Bockius LLP

(57) ABSTRACT

A printed circuit board includes a core layer having a through portion, a magnetic member disposed in the through portion and comprising a magnetic layer, a first coil pattern attached to one surface of the magnetic layer via an adhesive, and a first build-up layer covering at least a portion of the core layer, at least a portion of the magnetic member, and at least a portion of the first coil pattern, and disposed in at least a portion of the through portion.

21 Claims, 12 Drawing Sheets

(51) Int. Cl.
*H01F 27/28* (2006.01)
*H01F 27/29* (2006.01)
*H01F 27/245* (2006.01)
*H01F 27/255* (2006.01)
*H01F 41/00* (2006.01)
*H01F 41/02* (2006.01)
*H01F 41/04* (2006.01)
*H01F 41/06* (2016.01)
*H01F 41/24* (2006.01)
*H05K 1/11* (2006.01)

(56) References Cited

U.S. PATENT DOCUMENTS

| | | | | |
|---|---|---|---|---|
| 6,531,945 | B1* | 3/2003 | Ahn | H01F 5/003 29/602.1 |
| 10,204,733 | B2* | 2/2019 | Sugiyama | H01L 28/00 |
| 2003/0011458 | A1* | 1/2003 | Nuytkens | H01F 41/02 336/200 |
| 2007/0075819 | A1* | 4/2007 | Okuzawa | H01F 17/0033 336/200 |
| 2009/0146898 | A1* | 6/2009 | Akiho | H01Q 1/243 343/787 |
| 2009/0301766 | A1 | 12/2009 | Park et al. | |
| 2010/0053014 | A1* | 3/2010 | Yosui | H01Q 1/20 343/787 |
| 2010/0259352 | A1* | 10/2010 | Yan | H01F 5/003 336/200 |
| 2010/0277267 | A1* | 11/2010 | Bogert | H01F 3/10 336/221 |
| 2010/0309081 | A1* | 12/2010 | Kobayashi | H01Q 7/06 343/788 |
| 2013/0187255 | A1* | 7/2013 | Wang | H01F 27/2871 257/531 |
| 2013/0223033 | A1* | 8/2013 | Mano | H05K 1/18 361/763 |
| 2013/0234819 | A1* | 9/2013 | Yoo | H01F 17/0013 336/200 |
| 2013/0234820 | A1* | 9/2013 | Yoo | H01F 41/046 336/200 |
| 2013/0342301 | A1* | 12/2013 | Mano | H01F 27/24 336/200 |
| 2014/0043196 | A1* | 2/2014 | Gouchi | H01Q 1/2225 343/788 |
| 2014/0062437 | A1* | 3/2014 | Malcolm | H02M 3/156 323/282 |
| 2014/0132386 | A1* | 5/2014 | Kostelnik | H01F 27/2804 336/200 |
| 2014/0198463 | A1* | 7/2014 | Klein | G01R 33/04 361/748 |
| 2015/0035638 | A1* | 2/2015 | Stephanou | H01F 17/0033 336/200 |
| 2015/0035718 | A1* | 2/2015 | Gouchi | H01Q 1/36 343/788 |
| 2015/0102970 | A1* | 4/2015 | Yosui | H01Q 7/06 343/788 |
| 2015/0173197 | A1* | 6/2015 | Cho | H01F 41/046 361/748 |
| 2015/0188228 | A1* | 7/2015 | Yosui | H01Q 1/243 343/788 |
| 2015/0235753 | A1* | 8/2015 | Chatani | H01F 27/255 336/200 |
| 2016/0049235 | A1* | 2/2016 | Parish | H01F 41/046 336/178 |
| 2016/0049236 | A1* | 2/2016 | Kneller | H01F 27/2895 336/178 |
| 2016/0111196 | A1* | 4/2016 | Francis | H01F 41/046 336/200 |
| 2016/0141099 | A1* | 5/2016 | Maekawa | H01F 29/08 307/104 |
| 2016/0254089 | A1* | 9/2016 | Parish | H01F 27/2895 336/199 |
| 2016/0254090 | A1* | 9/2016 | Lloyd | H01F 41/046 336/200 |
| 2016/0254091 | A1* | 9/2016 | Harber | H01F 27/266 336/221 |
| 2016/0307991 | A1* | 10/2016 | Kuo | H01L 23/5227 |
| 2017/0140866 | A1* | 5/2017 | Hong, II | H01F 27/245 |
| 2018/0308612 | A1* | 10/2018 | Park | H01F 5/04 |
| 2018/0342342 | A1* | 11/2018 | Taniguchi | H01F 41/041 |
| 2019/0139688 | A1* | 5/2019 | Kim | G02B 26/02 |
| 2019/0287815 | A1* | 9/2019 | Xu | H01F 27/2804 |
| 2019/0394878 | A1* | 12/2019 | Frauwallner | H05K 3/0011 |
| 2020/0066627 | A1* | 2/2020 | Do | H01L 23/5226 |

* cited by examiner

PRINTED CIRCUIT BOARD

CROSS-REFERENCE TO RELATED APPLICATION(S)

This application claims benefit of priority to Korean Patent Application No. 10-2019-0120528 filed on Sep. 30, 2019, in the Korean Intellectual Property Office, the disclosure of which is incorporated herein by reference in its entirety.

TECHNICAL FIELD

The present disclosure relates to a printed circuit board.

BACKGROUND

Central processing units (CPUs), application specific integrated circuits (ASICs), application processors (APs), and the like, receive power from power management integrated circuits (PMICs). Recently, a power supply switching frequency of the PMIC has been increasing to improve power efficiency. In this regard, there is demand for a package substrate in the form of a multilayer printed circuit board having a function of an inductor.

SUMMARY

An aspect of the present disclosure is to provide a printed circuit board having high magnetic permeability even at a high frequency and having a function of an inductor.

Another aspect of the present disclosure is to provide a printed circuit board having improved inductance performance by minimizing a distance between a coil pattern and a magnetic member.

Another aspect of the present disclosure is to provide a printed circuit board further having a function of a capacitor in addition to the function of an inductor.

According to an aspect of the present disclosure, multi-layer printed circuit board including a plurality of insulating layers and a plurality of wiring layer as well as a plurality of via layers is provided with a laminate in which a base layer and a magnetic layer disposed on the base layer is embedded in the plurality of insulating layers. A coil pattern attached to one surface of the magnetic layer of the laminate is formed on at least one of a plurality of the wiring layers via an adhesive.

For example, a printed circuit board according to an embodiment of the present disclosure may include a core layer having a through portion; a magnetic member disposed in the through portion and including a magnetic layer; a first coil pattern attached to one surface of the magnetic layer via an adhesive; and a first build-up layer covering at least a portion of the core layer, magnetic member, and first coil pattern, and disposed in at least a portion of the through portion.

For example, a printed circuit board according to an embodiment of the present disclosure may include a plurality of insulating layers, a plurality of wiring layers, and plurality of via layers. A laminate including a base layer and a magnetic, layer disposed on the base layer is embedded in one or more of the plurality of insulating layers. At least one of the plurality of wiring layers may include a coil pattern attached to one surface of the magnetic layer of the laminate via an adhesive.

If necessary, a printed circuit board according to an embodiment may further include a capacitor disposed parallel to the magnetic member in the through portion and embedded on the first build-up layer. Alternatively, the core layer may further include another through portion spaced apart from the through portion, where the printed circuit board further includes a capacitor disposed parallel to the magnetic member in the through portion and embedded in the first build-up layer.

For example, a printed circuit board according to an embodiment of the present disclosure may include a core layer having a through portion; a magnetic layer disposed in the through portion; a planar spiral coil pattern disposed on the magnetic layer; an insulating layer covering the planar spiral coil pattern and disposed in a portion of the through portion; and a wiring layer disposed on the insulating layer and connected to the planar spiral coil pattern through a via in the insulating layer.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Figure 1:
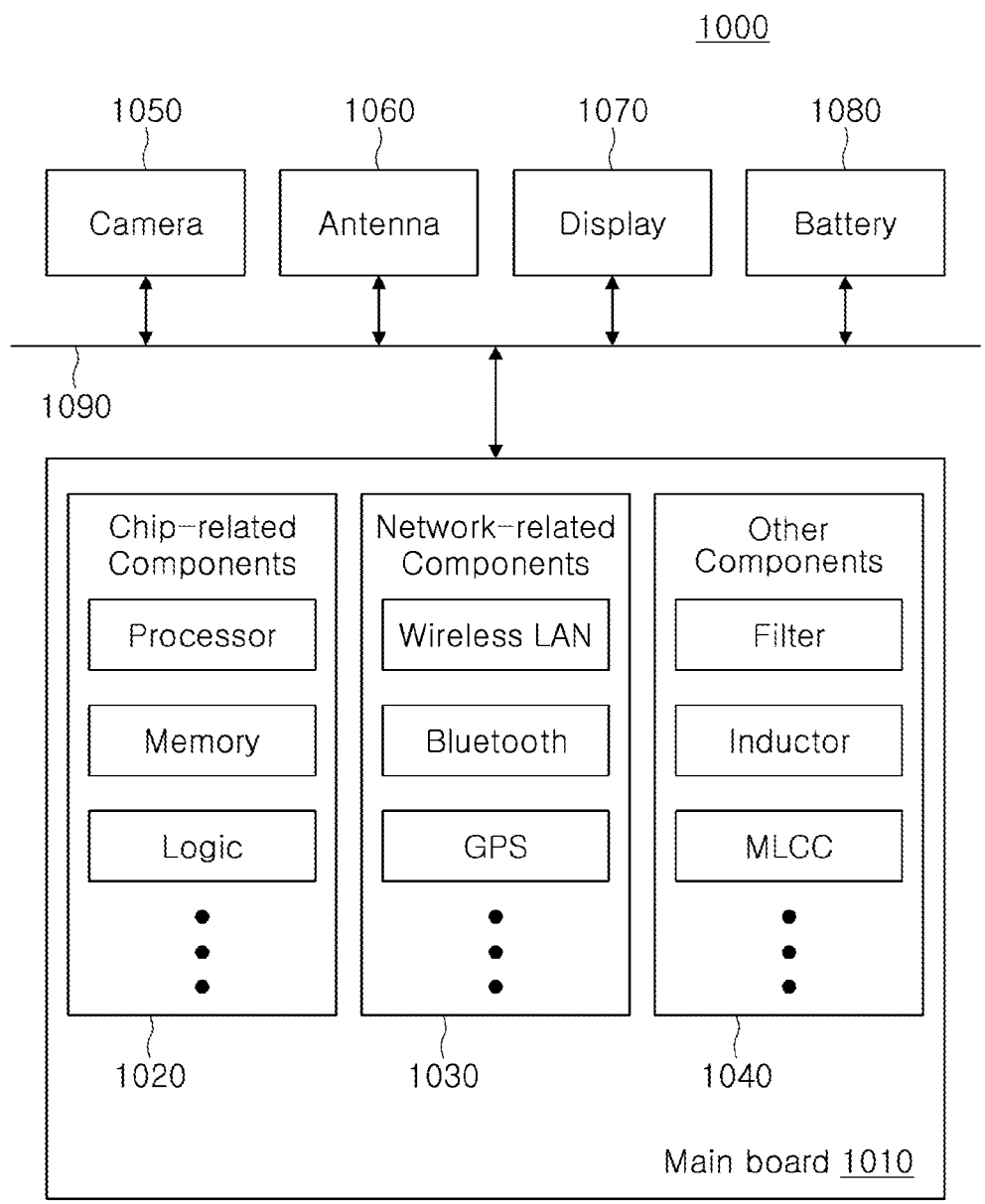
FIG. 1 is a block diagram illustrating an example of an electronic device system.

Hereinafter, the present disclosure will be described with reference to the accompanying drawings. In the drawings, shapes, sizes, and the like, of components may be exaggerated or omitted for clarity.

Electronic Device

FIG. 1 is a block diagram illustrating an example of an electronic device system.

Based on FIG. 1, the electronic device 1000 accommodates a main board 1010 therein. The main board 1010 includes chip-related components 1020, network-related components 1030, miscellaneous other components 1040, and the like, physically and/or electrically connected thereto. Said components are connected to other electronic components described below, thereby creating various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, but is not limited thereto. Other types of chip-related components may be included. In addition, these chip-related components 1020 may be combined with each other. The chip-related components 1020 may be in the form of a package containing the previously described chip-related components and/or electronic components.

The network-related component 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G and 5G protocols, and any other wireless and wired protocols designated after the abovementioned protocols, but is not limited thereto. The network-related components 1030 may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like, but are not limited thereto. The other components 1040 may also include passive components, or the like, used for various other purposes. In addition, the other components 1040 may be combined with each other, together with the chip-related components 1020 or the network-related components 1030 described above.

The electronic device 1000 may include other components, which may or may not be physically and/or electrically connected to the main board 1010, depending on a type of the electronic device 1000. These other components may include, for example, a camera module 1050, an antenna module 1060, a display device 1070, a battery 1080, but are not limited thereto. The other components may also include an audio codec, a video codec, a power amplifier, a compass, an accelerometer, a gyroscope, a speaker, a mass storage unit (for example, a hard disk drive), a compact disk (CD), a digital versatile disk, or the like. These other components may also include other components, or the like, used for various purposes depending on a type of electronic device 1000.

The electronic device 1000 may be a smartphone, a personal digital assistant (PDA), a digital video camera, a digital still camera, a network system, a computer, monitor, a tablet PC, a laptop PC, a netbook PC, a television, a video game machine, a smartwatch, an automotive component, or the like, but is not limited thereto. The electronic device 1000 may be any other electronic device processing data.

Figure 2:
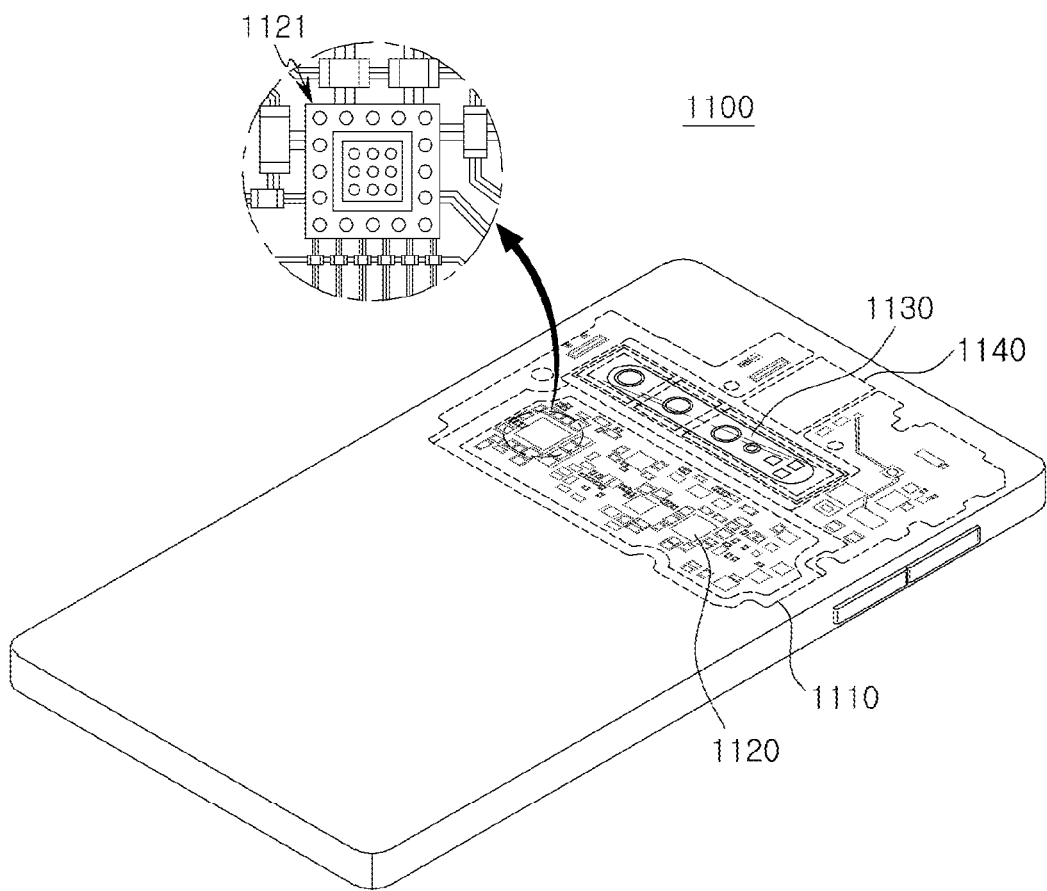
FIG. 2 is a perspective view schematically illustrating an example of an electronic device.

FIG. 2 is a perspective view schematically illustrating an example of an electronic device.

Based on FIG. 2, an electronic device may be a smartphone 1100. A mainboard 1110, to which various electronic components 1120 are physically and/or electrically connected, is accommodated in the smartphone 1100. Additionally, other components, which may or may not be physically and/or electrically connected to the mainboard 1110, such as a camera module 1130 and/or a speaker 1140, may be embedded in the smartphone 1100. Some of the electronic components 1120 may be the previously described chip-related components; for example, a semiconductor package 1121, but is not limited thereto. The semiconductor package 1121 may be in the form in which a semicoductive chip or a passive component is surface-mounted, but is not limited thereto. Meanwhile, the electronic device is not necessarily limited to the smartphone 1100 and may be other electronic devices as described above.

Printed Circuit Board

Figure 3:
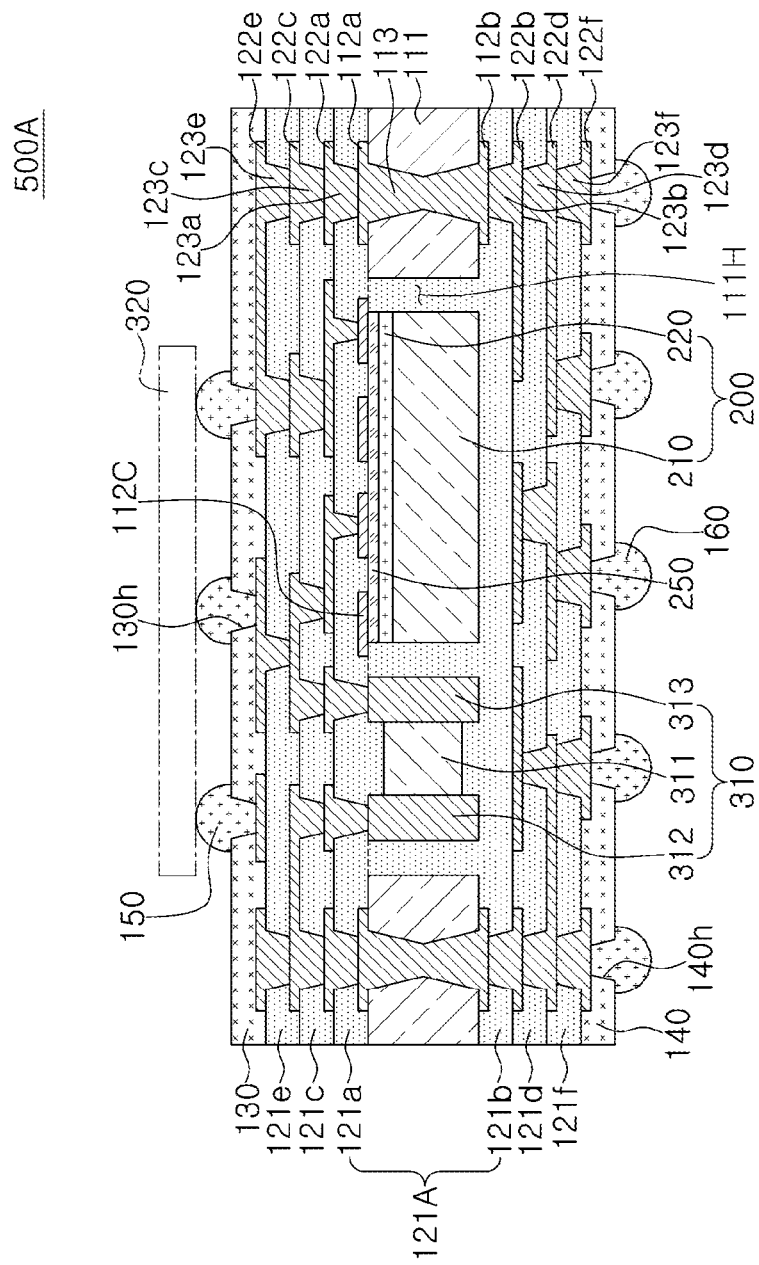
FIG. 3 is a cross-sectional view schematically illustrating an example of a printed circuit board.

FIG. 3 is a cross-sectional view schematically illustrating an example of a printed circuit board.

Figure 4:
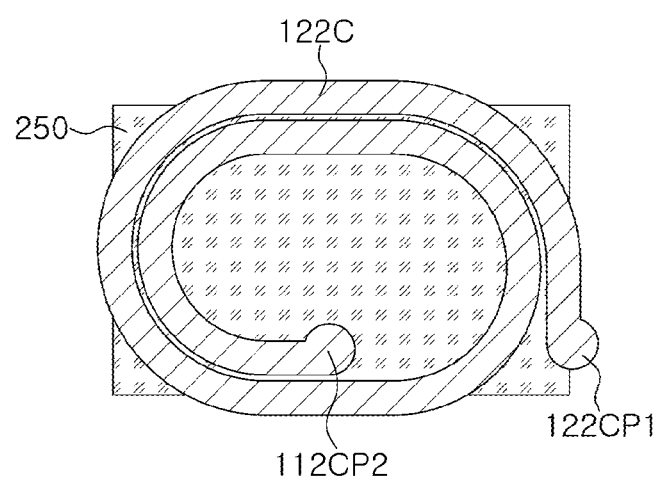
FIG. 4 is a planar view schematically illustrating coil pattern applied to the printed circuit board of FIG. 3.

FIG. 4 is a planar view schematically illustrating a coil pattern applied to the printed circuit board of FIG. 3.

Based on FIGS. 3 and 4, a printed circuit board 500A according to an example has a multilayer printed circuit board shape, in which a plurality of insulating layers 111 and 121a to 121f and a plurality of via layers 113, 123a to 123f are included. A magnetic member 200 is embedded in a plurality of the insulating layers 111 and 121a to 121f, and a coil pattern 112C in which at least a single wiring layer 112a of a plurality of wiring layers 112a, 112b and 122a to 122f is attached to the magnetic member 200 via an adhesive 250 is included.

For example, a printed circuit board 500A according to an example may include a core layer 111, first and second core wiring layers 112a and 112b respectively disposed on upper and lower surfaces of the core layer 1111, a core via layer 113 passing through at least a portion of the core layer 111, a first build-up layer 121A covering both surfaces of the core layer 111, a first wiring layer 122a disposed on an upper surface of an upper insulating layer 121a of the first build-up layer 121A, a second wiring layer 122b disposed on a lower surface of a lower insulating layer 121b of the first build-up layer 121A, a first via layer 123a passing through at least a portion of the upper insulating layer 121a of the first build-up layer 121A, a second via layer 123b passing through at least a portion of the lower insulating layer 121b of the first build-up layer 121A, a second build-up layer 121c disposed on the upper surface of the upper insulating layer 121a of the first build-up layer 121A, a third wiring layer 122c disposed on an upper surface of the second build-up layer 121c, a third via layer 123c passing through at least a portion of the second build-up layer 121c, a third build-up layer 121d disposed on the lower surface of the lower insulating layer 121b of the first build-up layer 121A, a fourth wiring layer 122d disposed on a lower surface of the third build-up layer 121d, a fourth via layer 123d passing through at least a portion of the third build-up layer 121d, a fourth build-up layer 121e disposed on an upper surface of the second build-up layer 121c, a fifth wiring layer 122e disposed on an upper surface of the fourth build-up layer 121e, a fifth via layer 123e passing through at least a portion of the fourth build-up layer 121e, a fifth build-up layer 121f disposed on the lower surface of the third build-up layer 121d, a sixth wiring layer 122f disposed on a lower surface of the fifth build-up layer 121f and a sixth via layer 123f passing through at least a portion of the fifth build-up layer 121f.

Alternatively, a printed circuit board 500A according to an example may further include a first passivation layer 130 disposed on an upper surface of the fourth build-up layer 121e and including a plurality of first openings 130h exposing at least a portion of the fifth wiring layer 122e, a second passivation layer 140 disposed on the lower surface of the fifth build-up layer 121f and including a plurality of second openings 140h exposing at least a portion of the sixth wiring layer 122f, a plurality of first electrical connection metals 150 independently disposed on a plurality of the first openings 130h and electrically connected to the exposed fifth wiring layer 122e and a plurality of second electrical connection metal 160 independently disposed on a plurality of the second openings 140h and electrically connected to the exposed sixth wiring layer 122f.

As previously described, CPUs, ASICs, APs, and the like, have recently been receiving power from PMICs. In this regard, power supply switching frequency of PMICs has been increasing to improve power efficiency. Accordingly, it can be considered to arrange an inductor on a mainboard, separately from a package substrate on which an integrated circuit (IC) is surface-mounted. In this case, however, not only a high capacity inductor is required, but also an electrical path between the inductor and the IC mounted on the package substrate elongates, thereby increasing resistance and lowering power efficiency. Alternatively, it can be considered to form a coil simply with a pattern inside the package board. In this case, however, it may be difficult to achieve capacity as the coil is formed in the air, rather than in a magnetic body. Further, a considerably large surface area of the package substrate needs to be employed to form a pattern coil, which may increase an overall size of the package substrate. It can also be considered to mount a die-shaped inductor on a bottom surface of the package board, but a price thereof may be high.

In contrast, a core layer 111 of a printed circuit board 500A according to an example includes a through portion 111H, and a magnetic member 200 is disposed in the through portion 111H. The magnetic member 200 is embedded in a first build-up layer 121A filling at least a portion of the through portion 111H. The magnetic member 200 is accommodated in the first build-up layer 121A filling at least a portion of the through portion 111H. Further, the first core wiring layer 112a includes a coil pattern 112C attached to the magnetic member 200. For example, a coil pattern 112C may be disposed at a level corresponding to the first core wiring layer 112a. As the printed circuit board 500A is in the form in which a magnetic member 200 is accommodated therein, high capacity can be easily achieved. For example, the magnetic member 200 may be a laminate including a magnetic layer 220 capable of maintaining high magnetic permeability at a high frequency. As coil pattern 112C is disposed on the magnetic member 200 at a minimum interval, thereby improving inductance performance. For example, the coil pattern 1120 may be attached to an upper surface of the magnetic layer 220 of the magnetic member 200 via an adhesive 250, thereby minimizing a gap between the magnetic layer 220 and the coil pattern 112C. This can increase inductance while minimizing a side effect such as increased direct current (DC) resistance (Rdc). In addition, as such coil pattern 112C may be formed only on an upper side of the core layer 111, degree of design freedom may be increased. As the magnetic member 200 is disposed in the through portion 111H of the core layer 111 and the coil pattern 1120 is attached to the magnetic member 200 in the form of a flat spiral, the printed circuit board 500A including the same may be thinned and miniaturized.

Meanwhile, a printed circuit board 500A according to an embodiment may further include a capacitor 310 disposed parallel to the magnetic member 200 in the through portion 111H and embedded in the first build-up layer 121A. The capacitor 310 may be a chip type component including a body 311 having an internal electrode and first and second external electrodes 312 and 313 spaced apart from each other in the body 311. For example, the capacitor 310 may be a multilayer ceramic capacitor (MLCC), but is not limited thereto. The first and second external electrodes 312 and 313 may be electrically connected to at least a portion of the first wiring layer 122a through a wiring via of the first via layer 123a, respectively. In addition to the magnetic member 200, the capacitor 310 may further be accommodated in the printed circuit board 500A according to an embodiment, which further provides capacitor functions in addition to inductor functions at a relatively low price. Further, the capacitor 310 is manufactured in the form of a separate component to be accommodated in the printed circuit 500A, thereby enabling slimming and miniaturization of the printed circuit board 500A. Further, when a printed circuit board 500A according to an embodiment is used as a package substrate, the capacitor 310, as the magnetic member 200 and the coil pattern 112C, can be positioned directly below the electronic component 320. This can minimize an electric path therebetween, and due to reduced equivalent series inductance (ESL), capacitor performance can be further improved.

Hereinbelow, components of a printed circuit board 500A according to an embodiment will be described with reference to the accompanying drawings.

The core layer 111 may be a core board, a center of the printed circuit board 500A. The core layer 111 may be formed of an insulating material, and as the insulating material, a thermosetting resin such as an epoxy resin, a thermoplastic resin such as polyimide, or a material, such as a copper clad laminate (CCL), an unclad CCL, or the like, including a glass fiber (or a glass cloth or a glass fabric) and/or a reinforcement material such as an inorganic filler together with the thermosetting or thermoplastic resin may be used, but it is not limited thereto. As the core layer 111, a metal plate, a glass plate, or a ceramic plate may be used. If necessary, a liquid crystal polymer may be used as a material of the core layer 111.

The core layer 111 has a through portion 111H in which a magnetic member 200 is disposed. The magnetic member 200 may be in the form of a laminate including a base layer 210 and a magnetic layer 220 disposed on the base layer 210. Adhesive 250 may be adhered to an upper surface of the magnetic layer 220. The adhesive 250 may connect a coil pattern 112C and the magnetic layer 220. If necessary, the magnetic member 200 may further include an illumination reduction layer disposed between the base layer 210 and the magnetic layer 220.

The base layer 210 may function as a board when forming the magnetic layer 220. For example, the magnetic layer 220 may be formed by sputtering, which involves depositing atoms or molecules from a target material on a surface of the base layer 210. The base layer 210 may include an insulating material, and may be, for example, prepreg, Ajinomoto Build-up Film (ABF), or the like. Alternately, the base layer 210 may made of a silicon wafer formed of single crystalline silicon (Si) and may be a silicon substrate.

The magnetic layer 220 may include a ferromagnetic material to increase a magnetic field induced by the coil pattern 112C. For example, the magnetic layer 220 may include a cobalt-tantalum-zirconium alloy, but is not limited thereto. When including the cobalt-tantalum zirconium alloy, the magnetic layer 220 may be formed by sputtering, thereby allowing the magnetic layer 220 to have a thin-film thickness, that is, a few micrometers of thickness. The magnetic layer 220 may be formed in a single layer or multiple layers. In the case of multiple layers, a thickness of each layer may be 0.1 µm to 3 µm, but is not limited thereto. Meanwhile, as the magnetic layer 220 is not formed directly on a printed circuit board, a thin-film magnetic layer 220 may be accommodated therein. For example, the base layer 210 is added to a thin film-forming apparatus to form a magnetic layer 220 followed by cutting a magnetic member 200 in a desired size to dispose in the through portion 111H of the core layer 111. Accordingly, the magnetic layer 220 in any size can be built in a printed circuit board without limitations according to a work size.

The adhesive may be a die attach film (DAF), which is known in the art. For example, the adhesive 250 may be an epoxy resin-base adhesive, but a material of the adhesive 250 is not limited thereto. Due to characteristics of a process described below, an upper surface of the adhesive 250 may be coplanar with the upper surface of the core layer 111. The term "coplanar" refers to not only being completely coplanar but also being substantially coplanar.

A material of the core wiring layers 112a and 112b may be a metal, and copper (Cu), aluminum (Al), silver (Ag), tin (Sn), gold (Au), nickel (Ni), lead (Pb), titanium (Ti), and alloys thereof may be used as the metal. The core wiring layers 112a and 112b may be formed by a plating process such as an additive process (AP), a semi additive process (SAP), a modified semi additive process (MSAP), tenting (TT), or the like, and as a result, may include a seed layer, which is an electroless plating layer, and an electroplating layer formed based on said seed layer. The core wiring layers 112a and 112b may perform various functions according to design of the corresponding layer. For example, a ground (GrouND: GND) pattern, a power (PoWeR: PWR) pattern, a signal (Signal: S) pattern, and the like, may be included. The S pattern may include various signals, for example, data signals, and the like, excluding the GND patterns and the PWR patterns. If necessary, the GND pattern and the PWR may be identical. These patterns may include a line pattern, a plane pattern and/or a pad pattern.

A material of the coil pattern 112C may be a metal, and copper (Cu), aluminum (Al), silver (Ag), tin (Sn), gold (Au), nickel (Ni), lead (Pb), titanium (Ti), and alloys thereof may be used as the metal. The coil pattern 112C may be simultaneously formed, through the previously described plating processes when the first core wiring layer 112a is formed, and as a result, may include a seed layer, which is an electroless plating layer, and an electroplating layer formed based on said seed layer. The coil pattern 112C may have a flat spiral shape. For example, the coil pattern 112C may be a coil having a plurality of turns in a same plane. Accordingly, a thin coil pattern having high inductance may be achieved. The coil pattern 112C may include terminal patterns 112CP1 and 112CP2 at one end and the other end thereof, respectively, for connection to wiring vias of the first via layer 123a. If necessary, the terminal patterns 112CP1 and 112CP2 of the coil pattern 112C at the one end and the other end thereof may be individually connected to at least a portion of the first core wiring layer 112a, instead of being connected to the wiring vias of the first via layers 123a.

A metal may be also used as a material of the core via layer 113, and copper (Cu), aluminum (Al), silver (Ag), tin (Sn), gold (Au), nickel (Ni), lead (Pb), titanium (Ti), and alloys thereof may be used as the metal. The core via layer 113 may be formed by AP, SAP, MSAP, TT, or other plating method, and can thus include a seed layer, which is an electroless plating layer, and an electroplating layer formed based on the seed layer. Each wiring via of the core via layer 113 may be fully charged with a metal or formed by a metal formed along a wall surface. In addition, all known shapes including am hourglass shape, a cylindrical shape, and the like, may be applied thereto. The core via layer 113, too, may perform various functions according to design of a corresponding layer. For example, the core via layer 113 may include a wiring via for signal connection, a wiring via for ground connection, a wiring via for power connection, and the like. The wiring vias for ground connection and power connection may be identical.

The build-up layers 121A and 121c to 121f may provide an insulating region for formation of multiple layers of wiring line on both sides of the core layer 111. A material of the build-up layers 121A and 121c to 121f may be an insulating material, and as for the insulating material, a thermosetting resin such as an epoxy resin, a thermoplastic resin such as polyimide, or a material, such as prepreg, ABF, or the like, including a glass fiber and/or reinforcement material such as an inorganic filler together with the thermosetting or thermoplastic resin may be used. If necessary, a photo imageable dielectric (PID) may be used as a material of the build-up layers 121A and 121c to 121f. Meanwhile, the build-up layers 121A and 121c to 121f may include the same materials or different materials. The build-up layers 121A and 121c to 121f may have clear or unclear boundaries. The first build-up layer 121A may include an upper insulating layer 121a and a lower insulating layer 121b, which are integrated thereby making boundaries thereof clear or unclear.

A metal may be used as a material of the wiring layers 122a to 122f, and copper (Cu), aluminum (Al), silver (Ag), tin (Sn), gold (Au), nickel (Ni), lead (Pb), titanium (Ti), and alloys thereof may be used as the metal. The wiring layers 122a to 122f may be formed by AP, SAP, MSAP, TT, or other plating method, and can thus include a seed layer, which is an electroless plating layer, and an electroplating layer formed based on said seed layer. The wiring layers 122a to 122f may perform various functions according to design of a corresponding layer. For example, a GND pattern, a PWR pattern, an S pattern, and the like, may be included. The S pattern may include various signals, for example, data signals, and the like, excluding the GND patterns and the PWR patterns. If necessary, the GND pattern and the PWR may be identical. These patterns may include a line pattern, plane pattern and/or a pad pattern.

A metal may be also used as a material of the via layers 123a to 123f, and copper (Cu), aluminum (Al), silver (Ag), tin (Sn), gold (Au), nickel (Ni), lead (Pb), titanium (Ti), and alloys thereof may be used as the metal. The via layers 123a to 123f may be formed by AP, SAP, MSAP, TT, or other plating method, and can thus include a seed layer, which is an electroless plating layer, and an electroplating layer formed based on said seed layer. Each wiring via of the via layers 123a to 123f may be fully charged with a metal or formed by a metal formed along a wall surface. In addition, all known shapes including an hourglass shape, a cylindrical shape, and the like, may be applied thereto. For example, the wiring vias of the first, third and fifth via layers 123a, 123c and 123e and those of the second, fourth and sixth via layers 123b, 123d and 123f may have a taper shape in opposite directions. The via layers 123a to 123f may perform various functions according to design of a corresponding layer. For example, the via layers 123a to 123f may include a wiring via for signal connection, a wiring via for ground connection, a wiring via for power connection, and the like. The wiring vias for ground connection and power connection may be identical.

The passivation layers 130 and 140 may protect an internal constitution of the printed circuit board according to an embodiment from physical or chemical damage, and the like, from outside. The passivation layers 130 and 140 may include a thermosetting resin. For example, the passivation layers 130 and 140 may be an ABF, but is not limited thereto. The passivation layers 130 and 140 may be known solder resist (SR) layers. Further, a PID may be included if necessary. Each of the passivation layers 130 and 140 may include a plurality of openings 130h and 140h, and each of the openings 130h and 140h can expose at least portions of the fifth and sixth wiring layers 122e and 122f, which are uppermost and lowermost wiring layers, of the printed circuit board 500A according to an embodiment, respectively. Meanwhile, the exposed fifth and sixth wiring layers 122e and 122f may have a surface treatment layer formed on a surface thereof. The surface treatment layer may be formed by, for example, electrolytic gold plating, electroless gold plating, organic solderability preservative (OSP) or electroless tin plating, electroless silver plating, electroless nickel plating/replacement gold plating, direct immersion gold (DIG) plating, hot air solder level (HASL), or the like. If necessary, each of the openings 130h and 140h may include a plurality of via holes. If necessary, an under bump metal (UBM) may be arranged in each opening 130h and 140h for reliability improvement.

The electrical connection metals 150 and 160 are a constitution for physical and/or electrical connection of the printed circuit board 500A to an outside. For example, an electronic component 320 may be mounted on the printed circuit board 500A according to an embodiment via the first electrical connection metal 150. Alternately, the printed circuit board 500A according to an embodiment may be mounted on a mainboard of the electronic device via the second electrical connection metal 160. For example, the printed circuit board 500A according to an embodiment may be a ball grid array (BGA)-type package board. The electrical connection metals 150 and 160 may be disposed on a plurality of the openings 130h and 140h of the passivation layers 130 and 140, respectively. The electrical connection metals 150 and 160 may include a metal, for example, Sn or an alloy including Sn, having a low melting point, that is, a metal having a melting point lower than Cu. For example, the electrical connection metals 150 and 160 may be formed with a solder, but is merely an example. A material thereof is not particularly limited thereto.

The electrical connection metals 150 and 160 may be a land, a ball, a pin, or the like. The electrical connection metals 150 and 160 may be formed in multilayers or a single layer. In the case of the multilayers, a copper pillar and a solder may be included whereas in the case of the single layer, a tin-silver solder may be included; however, this is merely an example, and is not limited thereto. The electrical connection metals 150 and 160 are not particularly limited in terms of a number, interval, disposition, or the like, and can be sufficiently modified by one of ordinary skill in the art according to design Particulars. The second electrical connection metal 160 is for mounting on the mainboard, and may be present in a larger number and have a larger size compared to the first electrical connection metal 150. In this aspect, a larger number of the second openings 140h may be present and the second openings 140h may be bigger compared to the first openings 130h.

The capacitor 310 may be a chip type component in which a body including internal electrodes and the first and second external electrodes 312 and 313 are spaced apart in the body are included. For example, the capacitor 310 may be an MLCC, but is not limited thereto. The first and second external electrodes 312 and 313 may be individually electrically connected to a portion of the first wiring layer 122a through a wiring via of the first via layer 113a.

The electronic component 320 may be a known active or known passive component. For example, the electronic component 320 may be a semiconductive chip or a semiconductive package including a semiconductive chip, but is not limited thereto and may be other known surface-mounting component.

Figure 5:
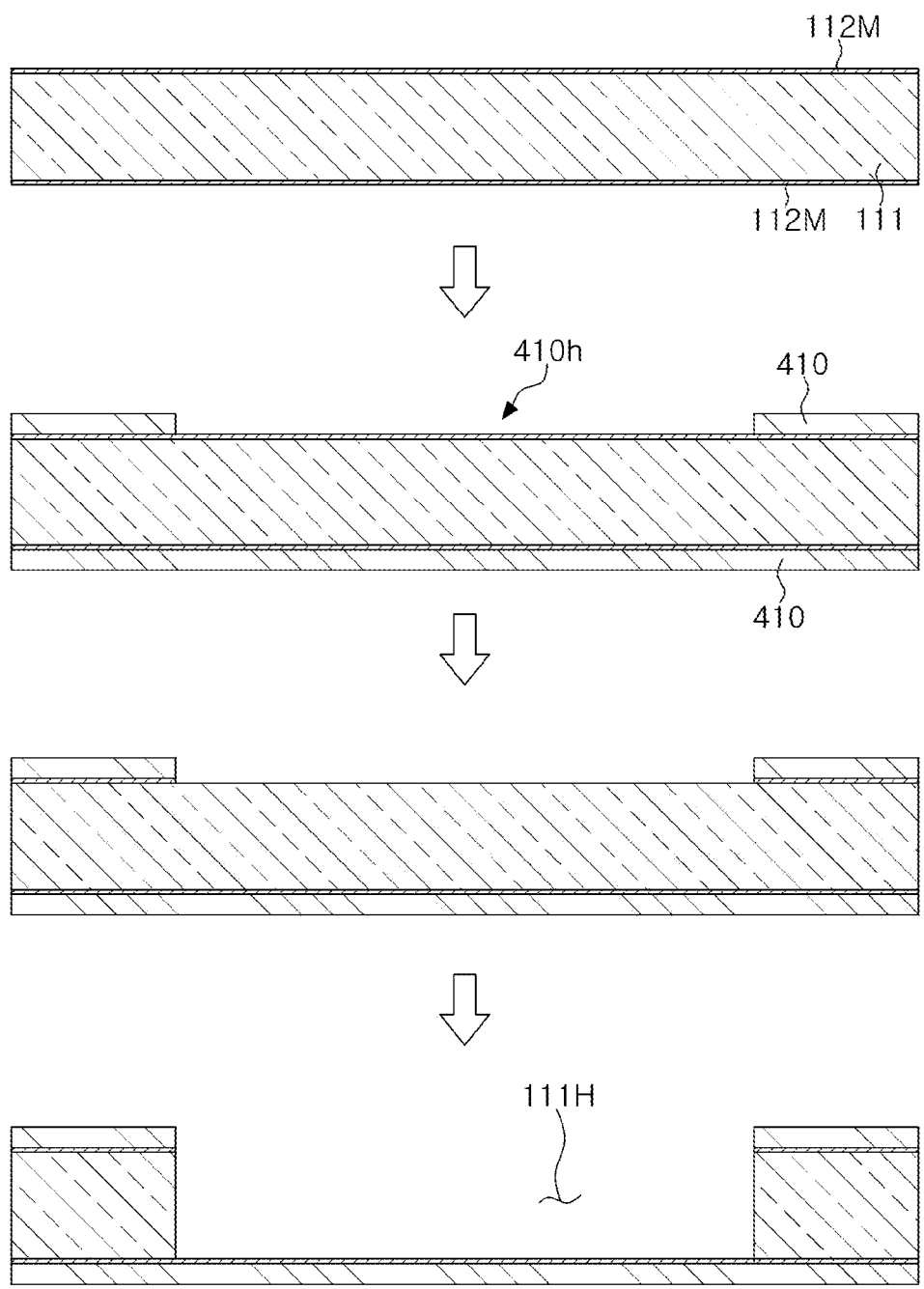
FIGS. 5 to 7 are process views schematically illustrating examples of manufacturing the printed circuit board of FIG. 3.
Figure 6:
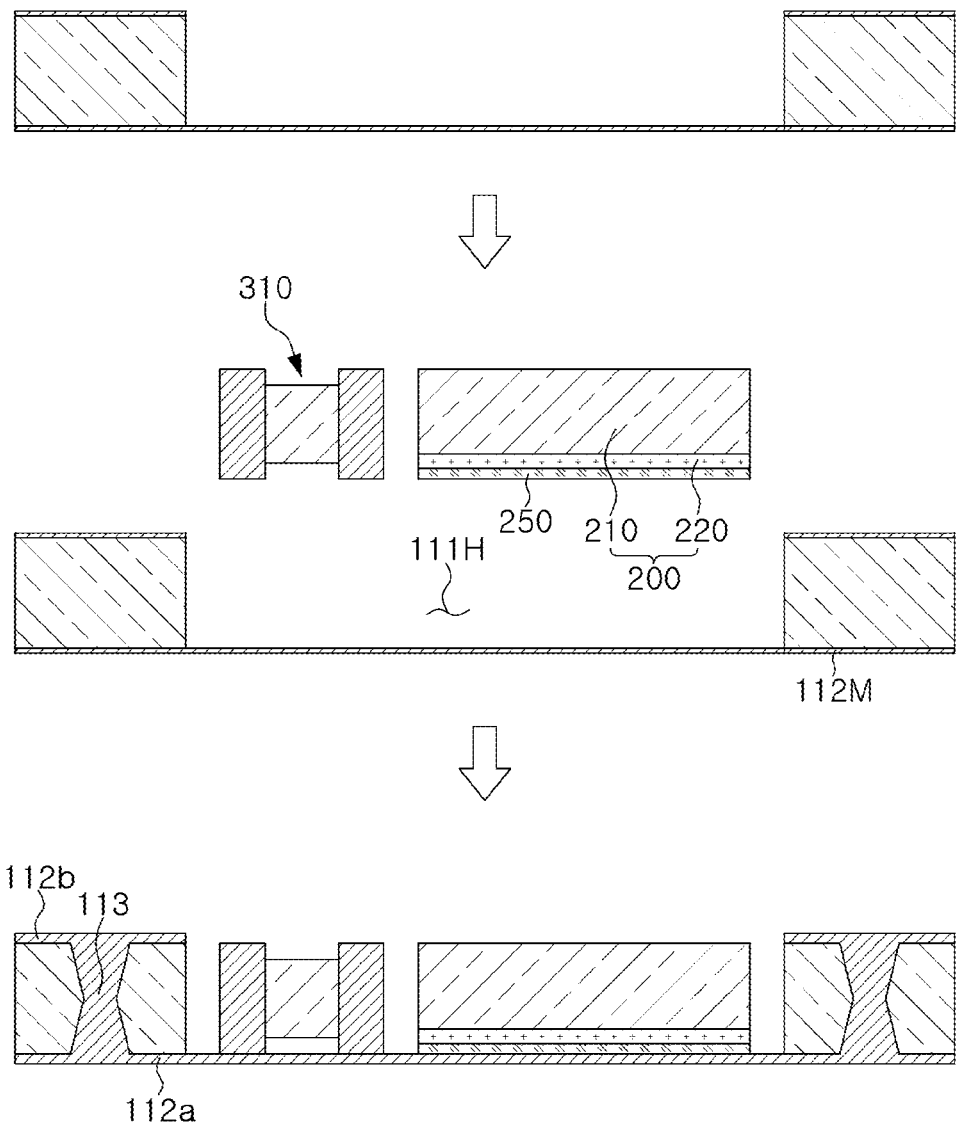
Figure 7:
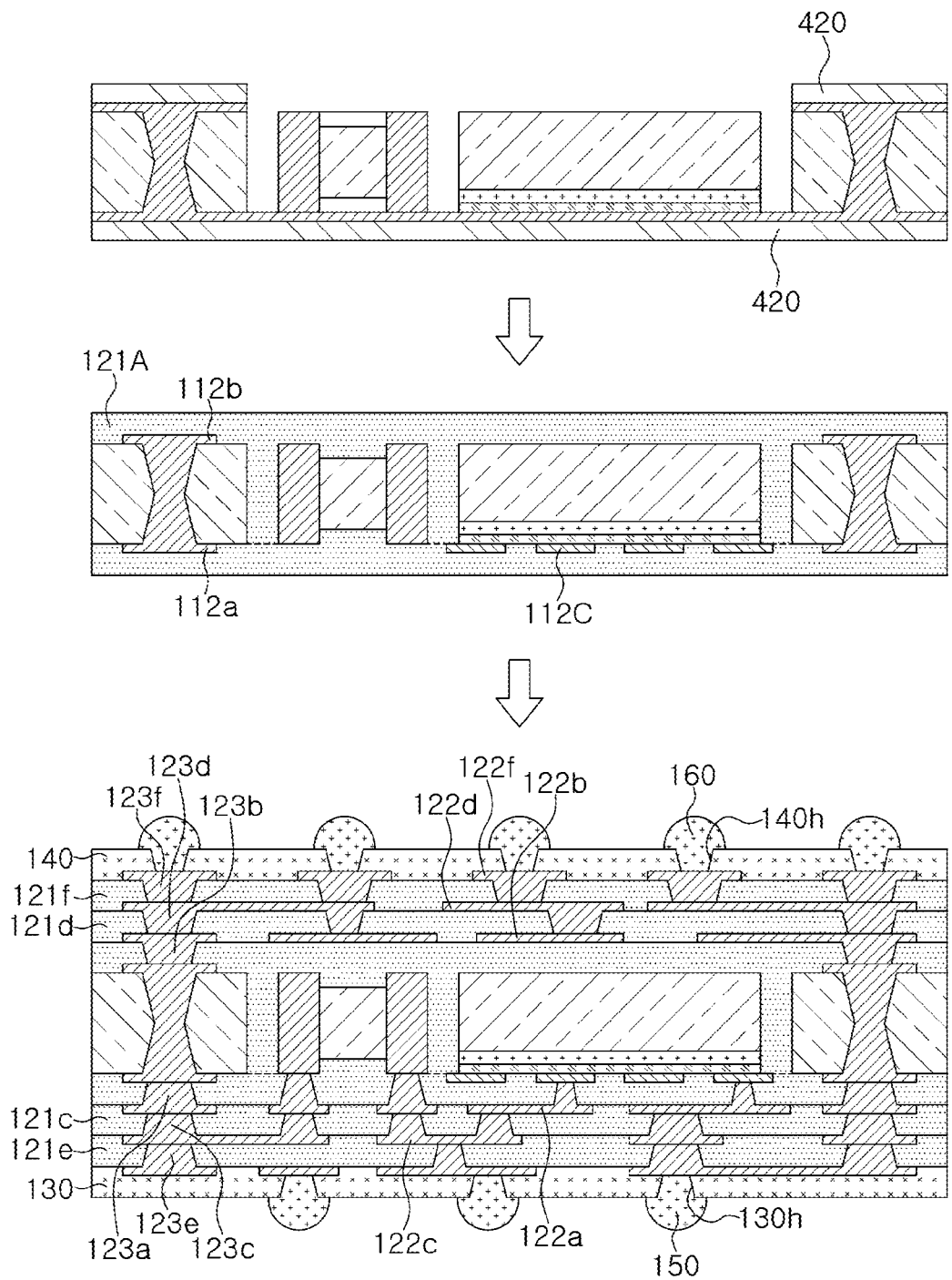

FIGS. 5 to 7 are process views schematically illustrating examples of manufacturing the printed circuit board of FIG. 3.

Based on FIG. 5, a CCL in which a copper foil 112M was laminated on both surfaces of the core layer 111 is first prepared. A dry film 410 is then disposed on each of the copper foils on both surfaces of the CCL. The dry film 410 on the lower side may be patterned so as to have an opening 410h. The copper foil 112M on the lower side, which is exposed through the opening 410h is removed by etching. A blaster process is employed to form a through portion 111H passing through the core layer 111.

Based on FIG. 6, the dry film 410 is delaminated. A magnetic member 200 prepared in advance is disposed in the through portion 111H. The magnetic member 200 may be attached to the lower copper foil 112M via an adhesive 250. The magnetic layer 220 may be formed by sputtering, for example, by depositing atoms or molecules from a target material on a surface of the base layer 210. Meanwhile, a capacitor 310 may be disposed together if necessary. The core via layer 113 and the first and second core wiring layers 112a and 112b prior to the patterning are formed by via hole processing and a plating process such as AP, SAP, MASP, TT, or the like.

Based on FIG. 7, another dry film 420 is attached. The dry film 420 is then patterned, and the patterned dry film 420 is used to pattern the first and, second core wiring layers 112a and 112b. Further, a coil pattern 112C is formed. Prepreg or ABF is laminated on both sides of the core layer 111 to form a first build-up layer 121A. A first wiring layer 122a, a second wiring layer 122b, a first via layer 123a, a second via layer 123b, a second build-up layer 121c, a third wiring layer 122c, a third via layer 123c, third build-up layer 121d, a fourth wiring layer 122d, fourth via layer 123d, a fourth build-up layer 121e, a fifth wiring layer 122e, and a fifth via layer 123e, a fifth build-up layer 121f, a sixth wiring layer 122f, and the sixth via layer 123f are formed by a double-sided build-up process and a plating process. Additionally, first and second passivation layers 130 and 140 may further be formed if necessary. First and second openings 130h and 140h may be formed if necessary. First and second electrical connection metals 150 and 160 are formed if necessary. A printed circuit board may be manufactured through a series of Processes, and the printed circuit board, if inverted up and down, gives rise to the printed circuit board 500A according to the previously described embodiment.

Figure 8:
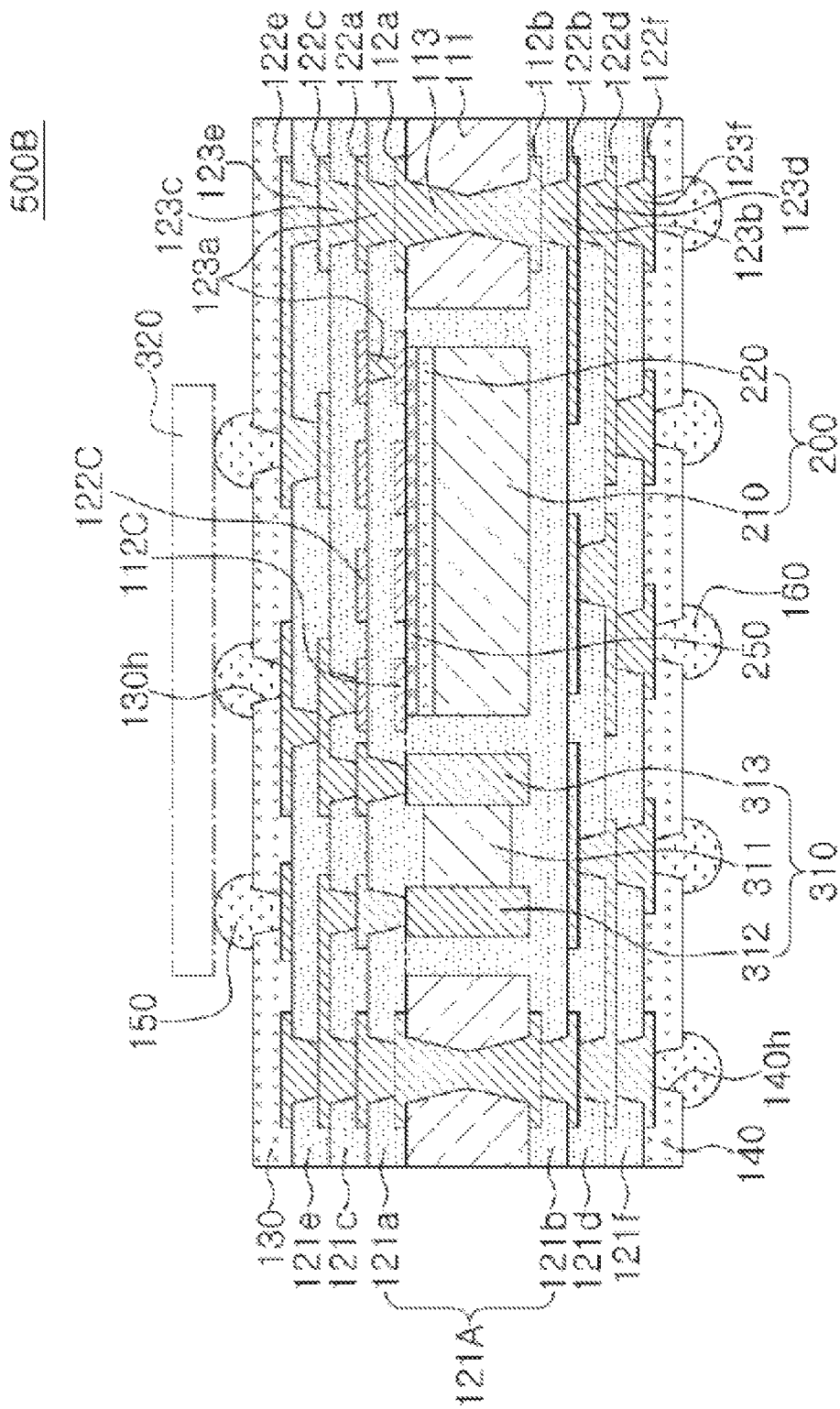
FIG. 8 is a cross-sectional view schematically illustrating another example of a printed circuit board.

FIG. 8 is a cross-sectional view schematically illustrating another example of a printed circuit board.

Based on FIG. 8, in a printed circuit board 500B according to another embodiment, the first wiring layer 122a of the printed circuit board 500A according to the previously described embodiment includes a second coil pattern 122C. For example, the second coil pattern 122O may be disposed at a level corresponding to the first wiring layer 122*a* of the upper surface of the first build-up layer 121A. The first and second coil patterns 112C and 122C, each being in required positions, may be electrically connected to each other through the wiring vias of the first via layer 123*a*. The second coil pattern 122C may be electrically connected to at least a portion of the third wiring layer 122*c* through the wiring via of the third via layer 123*c*. If necessary, at least one end of each of the first and second coil patterns 112C and 122C may be electrically connected to at least a portion of each of the first core wiring layer 112*a* and the first wiring layer 122*a*, respectively. A material, a shape, and the like, of the second coil pattern 122C may be substantially the same as described with respect to the first coil pattern 1120. As such, the coil pattern may be formed in multilayers, which may serve to an increased inductance value. Other descriptions are substantially the same as the above, and thus, detailed descriptions thereof will be omitted.

Figure 9:
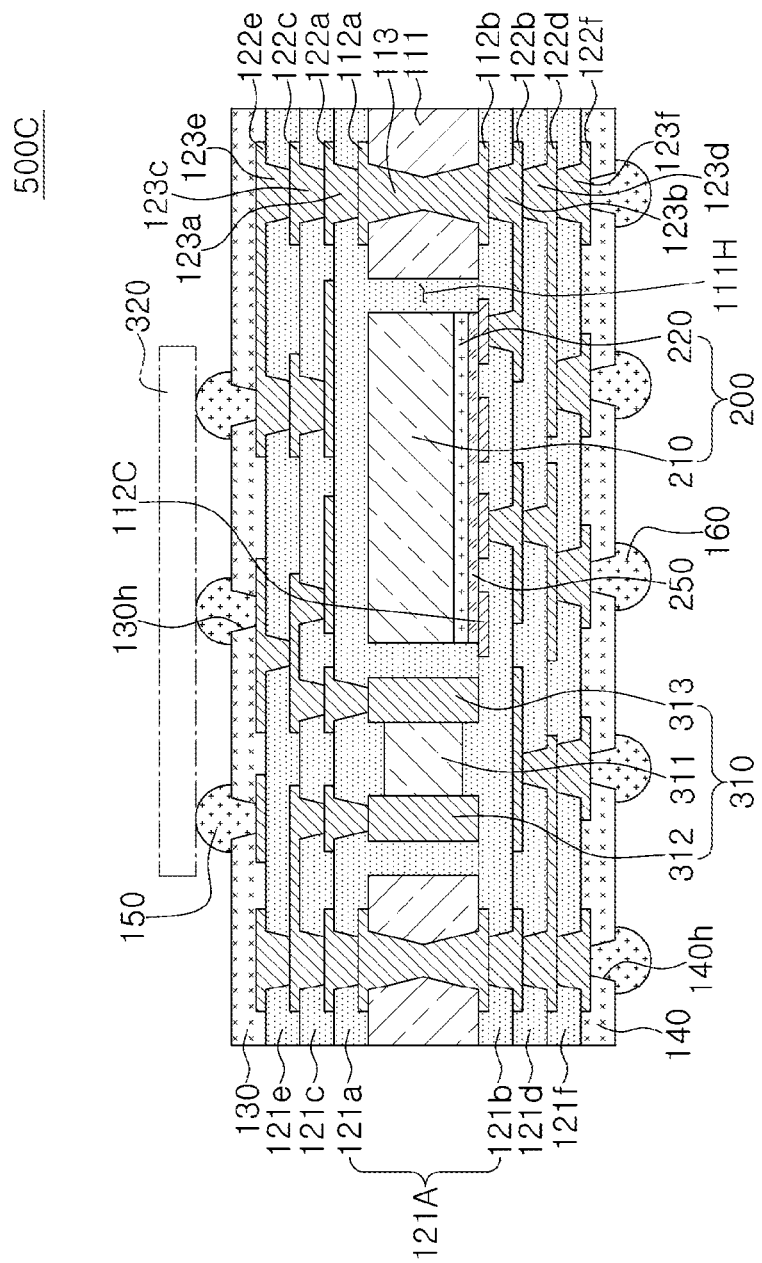
FIG. 9 is a cross-sectional view schematically illustrating another example of a printed circuit board.

FIG. 9 is a cross-sectional view schematically illustrating another example of a printed circuit board.

Based on FIG. 9, in a printed circuit board 500C according to another embodiment, the magnetic member 200 of the printed circuit board 500A according to the previously described embodiment is inverted. For example, a coil pattern 112C may be disposed at a level corresponding to the second wiring layer 112*b*. The coil pattern 112C may be electrically connected to at least a portion of the second wiring layer 122*b* through a wiring via of the second via layer 123*b*. If necessary, at least one end of the coil pattern 112C may be electrically connected to at least portion of the second core wiring layer 112*b*. Other descriptions are substantially the same as the above, and thus, detailed descriptions thereof will be omitted.

Figure 10:
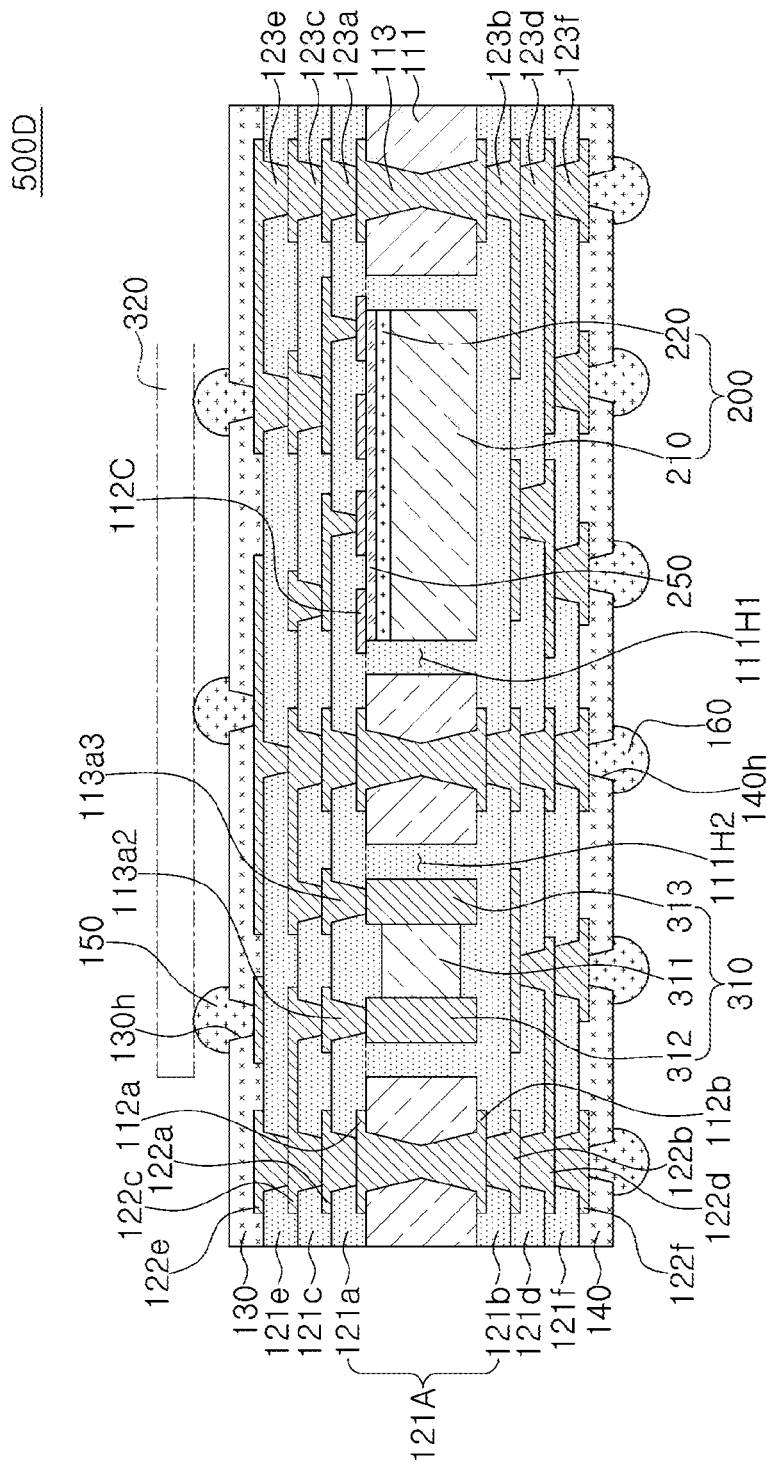
FIG. 10 is a cross-sectional view schematically illustrating another example of a printed circuit board.

FIG. 10 is a cross-sectional view schematically illustrating another example of a printed circuit board.

Based on FIG. 10, a printed circuit board 500D according to another embodiment includes a core layer 111, in which first and second through portions 111H1 and 111H2 are spaced apart. In the first and second through portions 111H1 and 111H2, a magnetic member 200 and a capacitor 310 are disposed in parallel, respectively. A first build-up layer 121A partially fills the first and second through portions 111H1 and 111H2, thereby accommodating the magnetic member 200 and the capacitor 310. Other descriptions are substantially the same as the above, and thus, detailed descriptions thereof will be omitted.

Figure 11:
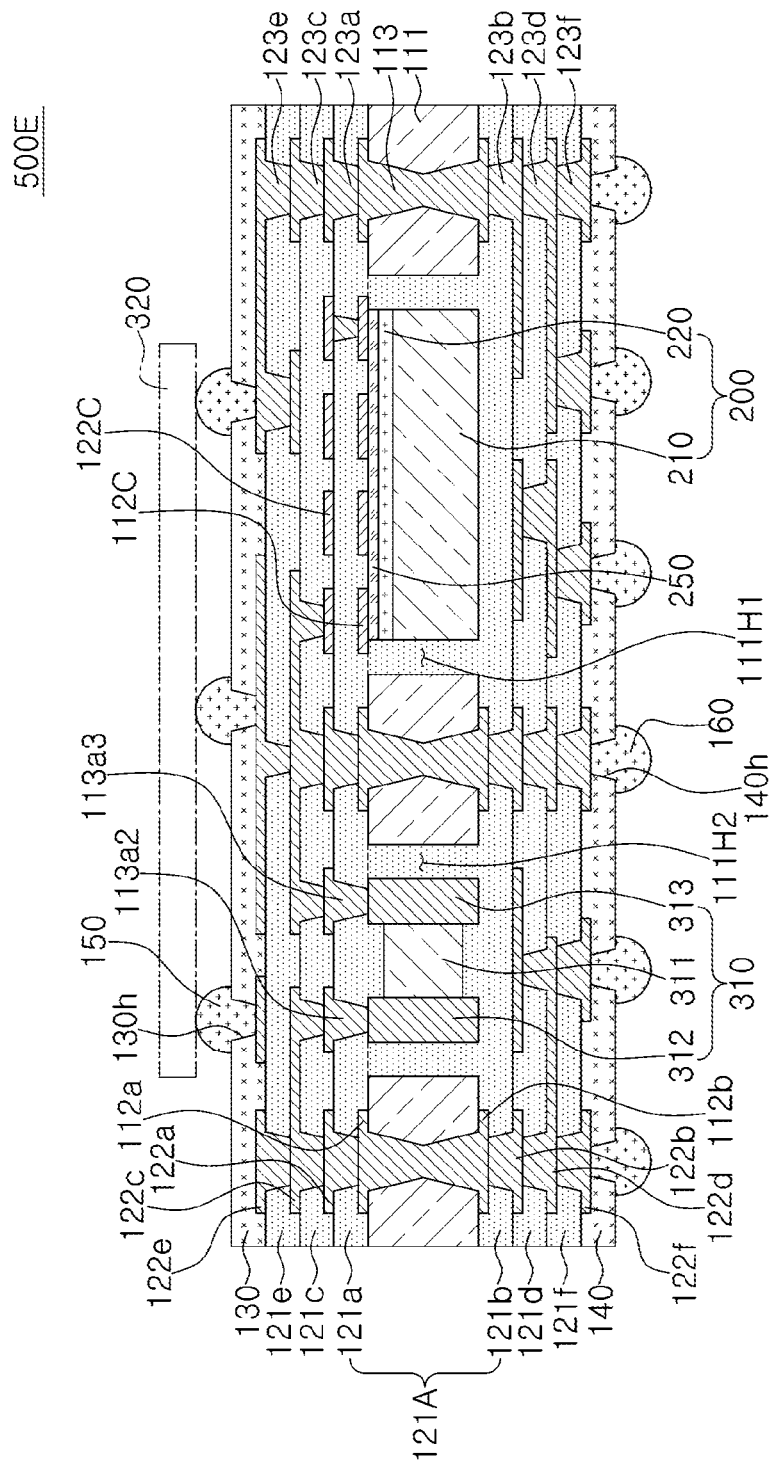
FIG. 11 is a cross-sectional view schematically illustrating another example of a printed circuit board.

FIG. 11 is a cross-sectional view schematically illustrating another example of a printed circuit board.

Figure 12:
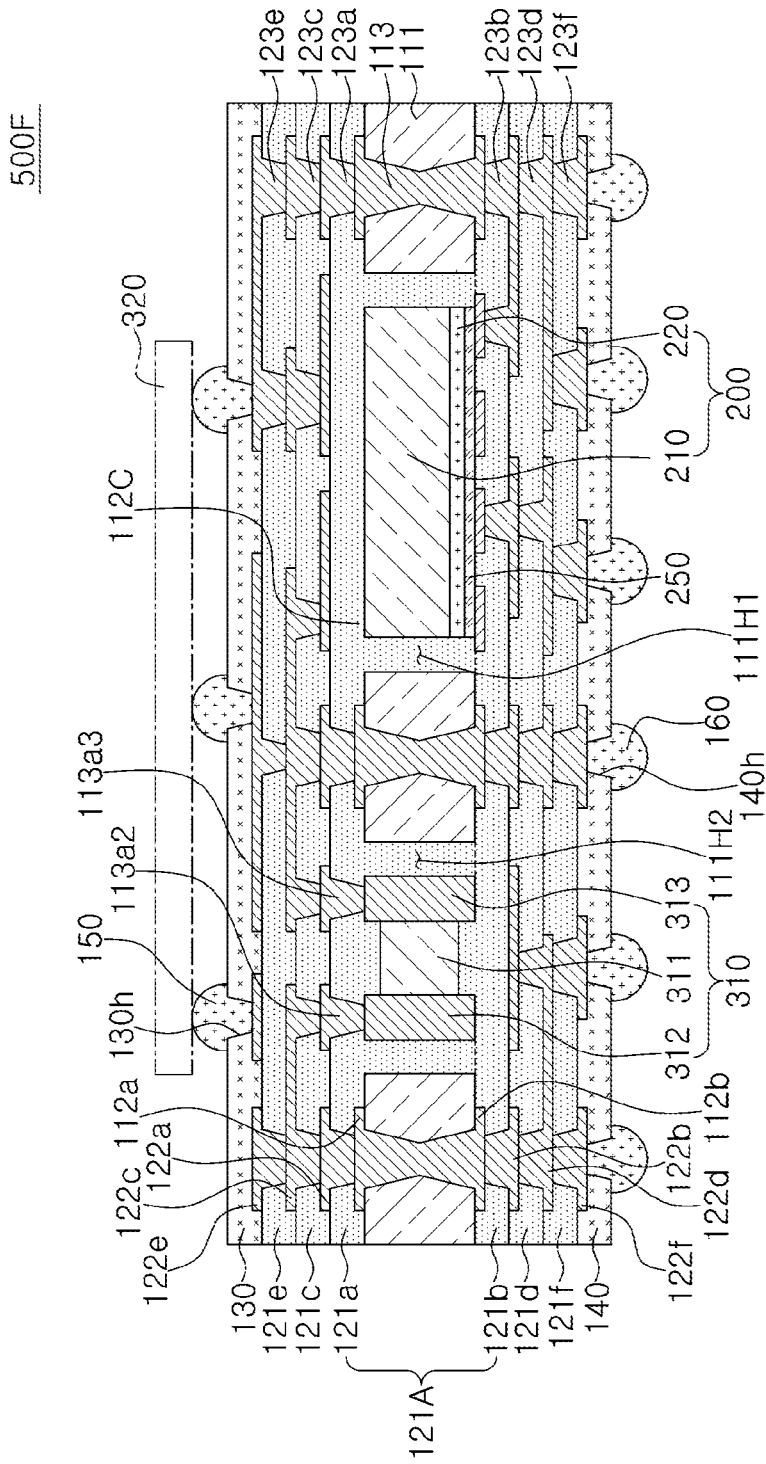
FIG. 12 is a cross-sectional view schematically illustrating another example of a printed circuit board.

FIG. 12 is a cross-sectional view schematically illustrating another example of a printed circuit board.

Based on FIGS. 11 and 12, in a printed circuit board 500E according to another embodiment, the first wiring layer 122*a* of the printed circuit board 500D according to the previously described embodiment includes a second coil pattern 122C. In a printed circuit board 500E according to another embodiment, the magnetic member 200 according to the printed circuit board 500D according to the previously described embodiment is upside down and the second core wiring layer 112*b* includes a coil pattern 112C. For example, the coil pattern 112C may be disposed at a level corresponding to the second core wiring layer 112*b*. Other descriptions are substantially the same as the above, and thus, detailed descriptions thereof will be omitted.

As one of the effects of the present disclosure, a printed circuit board having high magnetic permeability even at a high frequency and a function of an inductor may be provided.

As another effect, a printed circuit board having improved inductance performance may be provided by minimizing a space between a coil pattern and a magnetic member.

As another effect, a printed circuit board having a function of a capacitor, in addition to that of an inductor, may be provided.

As used herein, the terms "side portion," "side surface," and the like, are used to refer to a direction toward a first or second direction or a surface on said direction. The terms "upper side," "upper portion", "upper surface," and the like, are used to refer to a direction toward a third direction or a surface on said direction, while the terms "lower side," "lower portion," "lower surface," and the like, are used to refer to a direction opposite to the direction toward the third direction or a surface on said direction. In addition, said spatially relative terms have been used as a concept including a case in which a target component is positioned in a corresponding direction, but does not directly contact a reference component, as well as a case in which the target component directly contacts the reference component in the corresponding direction. However, the terms may be defined as above for ease of description, and the scope of right of the exemplary embodiments is not particularly limited to the above terms.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and do not necessarily refer to the same embodiment. Furthermore, the particular characteristics or features may be combined in any suitable manner in one or more embodiments. For example, a context described in a specific exemplary embodiment may be used in other embodiments, even if it is not described in the other embodiments, unless it is described contrary to or inconsistent with the context in the other embodiments.

Terms used herein are used only in order to describe an exemplary embodiment rather than limiting the present disclosure. In this case, singular forms include plural forms unless interpreted otherwise in context.

While example embodiments have been illustrated and described above, it will be apparent to those skilled in the art that modifications and variations could be made without departing from the scope of the present disclosure as defined by the appended claims.

What is claimed is:

1. A printed circuit board, comprising:
   a core layer having a through portion extending through one surface and another surface of the core layer;

a magnetic member disposed in the through portion and comprising a magnetic layer;

a first coil pattern attached to one surface of the magnetic layer via an adhesive;

a first build-up layer covering at least a portion of the core layer, at least a portion of the magnetic member, and at least a portion of the first coil pattern, and the first build-up layer disposed in at least a portion of the through portion; and a first core wiring layer disposed on the one surface of the core layer, the first core wiring layer of which at least a portion is covered by the first build-up layer, wherein the adhesive is disposed in the through portion, an interface surface of the adhesive and the first coil pattern is coplanar with the one surface of the core layer, the first core wiring layer is positioned on a level corresponding to the first coil pattern, and an entirety of the first coil pattern other than a surface of the first coil pattern contacting the adhesive is positioned outside a level between the one surface and the another surface.

2. The printed circuit board of claim 1, wherein the first coil pattern has a planar spiral shape.

3. The printed circuit board of claim 1, wherein the magnetic member comprises a base layer and the magnetic layer disposed on the base layer.

4. The printed circuit board of claim 3, wherein the base layer comprises a silicon (Si) substrate.

5. The printed circuit board of claim 3, wherein the magnetic layer comprises a cobalt-tantalum-zirconium alloy.

6. The printed circuit board of claim 1, further comprising:

a second core wiring layer disposed on the other surface of the core layer, the second core wiring layer of which at least a portion is covered by the first build-up layer; and a core via layer passing through at least a portion of the core layer.

7. The printed circuit board of claim 6, further comprising a first wiring layer disposed on one surface of the first build-up layer; and a first via layer passing through at least a portion of the first build-up layer.

8. The printed circuit board of claim 7, wherein the first via layer comprises at least one wiring via connecting at least a portion of the first wiring layer and the first coil pattern to each other.

9. The printed circuit board of claim 7, further comprising a second coil pattern disposed on one surface of the first build-up layer, wherein the first via layer comprises at least one wiring via connecting the first and second coil patterns to each other, and the first wiring layer is positioned on a level corresponding to the second coil pattern.

10. The printed circuit board of claim 7, further comprising:

a second wiring layer disposed on the other surface of the first build-up layer; and a second via layer passing through at least a portion of the first build-up layer.

11. The printed circuit board of claim 10, further comprising:

one or more second build-up layers disposed on the one surface of the first build-up layer;

one or more third build-up layers disposed on the other surface of the first build-up layer;

one or more third wiring layer respectively disposed on the one or more second build-up layers;

one or more fourth wiring layer respectively disposed on the one or more third build-up layers;

one or more third via layers respectively passing through at least a portion of the one or more second build-up layers; and one or more fourth via layers respectively passing through at least a portion of the one or more third build-up layers.

12. The printed circuit board of claim 11, further comprising:

a first passivation layer disposed on one side of the one or more second build-up layers and comprising a plurality of first openings; and a second passivation layer disposed on the other side of the one or more third build-up layers and comprising a plurality of second openings.

13. The printed circuit board of claim 1, further comprising a capacitor disposed parallel to the magnetic member in the through portion and embedded in the first build-up layer.

14. The printed circuit board of claim 13, further comprising:

a second core wiring layer disposed on the other surface of the core layer, the second core wiring layer of which at least a portion is covered by the first build-up layer;

a first wiring layer disposed on one surface of the first build-up layer; and a first via layer passing through at least a portion of the first build-up layer, wherein the first via layer comprises one wiring via connecting a portion of the first wiring layer and the first coil pattern to each other, and another wiring via connecting another portion of the first wiring layer and the capacitor to each other.

15. The printed circuit board of claim 13, further comprising:

a second core wiring layer disposed on the other surface of the core layer, the second core wiring layer of which at least a portion is covered by the first build-up layer;

a first wiring layer disposed on one surface of the first build-up layer;

a first via layer passing through at least a portion of the first build-up layer;

a second wiring layer disposed on the other surface of the first build-up layer; and a second via layer passing through at least a portion of the first build-up layer, wherein the first via layer comprises one wiring via connecting a portion of the first wiring layer and the capacitor to each other, and the second via layer comprises one wiring via connecting a portion of the second wiring layer and the first coil pattern to each other.

16. The printed circuit board of claim 1, wherein the core layer comprises another through portion spaced apart from the through portion, wherein the printed circuit board further comprises a capacitor disposed parallel to the magnetic member in the another through portion and embedded in the first build-up layer.

17. The printed circuit board of claim 1, wherein no coil pattern is disposed in the through portion.

18. A printed circuit board, comprising:
a core layer having a through portion extending through one surface and another surface of the core layer;
a magnetic member disposed in the through portion and comprising a magnetic layer;
a coil pattern attached to one surface of the magnetic layer via an adhesive;
a build-up layer including an insulating layer covering at least a portion of one of the one surface and the another surface of the core layer, at least a portion of the magnetic member, and at least a portion of the coil pattern; and
a first core wiring layer disposed on the one surface of the core layer, the first core wiring layer of which at least a portion is covered by the first build-up layer,
wherein the insulating layer of the build-up layer extends from the one of the one surface and the another surface to be disposed in at least a portion of the through portion,
the magnetic member is spaced apart from the core layer by a portion of the insulating layer of the build-up layer disposed in the through portion and is in contact with the portion of the insulating layer of the build-up layer disposed in the through portion,
the first core wiring layer is positioned on a level corresponding to the coil pattern, and
an entirety of the coil pattern other than a surface of the coil pattern contacting the adhesive is positioned outside a level between the one surface and the another surface.

19. The printed circuit board of claim 18, further comprising:
a second core wiring layer disposed on the other surface of the core layer, the second core wiring layer of which at least a portion is covered by the build-up layer; and
a core via layer passing through at least a portion of the core layer.

20. The printed circuit board of claim 18, wherein the magnetic member comprises a base layer and the magnetic layer, and
the magnetic layer is disposed between the base layer and the adhesive.

21. The printed circuit board of claim 18, wherein no coil pattern is disposed in the through portion.

* * * * *